(12) United States Patent
Aoki (10) Patent No.: US 6,888,869 B2
(45) Date of Patent: May 3, 2005

(54) SEMICONDUCTOR LASER (75) Inventor: Masahiro Aoki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 200 days.

(21) Appl. No.: 10/082,338

(22) Filed: Feb. 26, 2002

(65) Prior Publication Data
US 2003/0021319 A1 Jan. 30, 2003

(30) Foreign Application Priority Data

Jul. 30, 2001 (JP) ........................................ 2001-228866

(51) Int. Cl.$^7$ ............................................. H01S 5/00
(52) U.S. Cl. ....................................................... 372/46
(58) Field of Search ................................ 372/43–50, 96

(56) References Cited

U.S. PATENT DOCUMENTS 5,953,357 A * 9/1999 Hirata et al. ................... 372/46
6,219,366 B1 * 4/2001 Furushima ..................... 372/50

FOREIGN PATENT DOCUMENTS

| JP | 6-302003 | 4/1993 |
| JP | 2000-68610 | 3/1996 |
| JP | 8-330680 | 5/1996 |
| JP | 10-11781 | 6/1996 |
| JP | 11-87831 | 9/1997 |
| JP | 2000-138411 | 10/1998 |

OTHER PUBLICATIONS

F. Issiki, S. Fukatsu, Y, Shiraki, "Efficient Luminescence from AlP/GaP Neighboring Confinement Structure with AlGap Barrier Layers", 1995 American Institute of Physics, Appl. Phys. Lett,. 67 (8), Aug. 21, 1995, pp. 1048–1050.

N. Usami, F. Issiki, K. Nayak, Y. Shiraki and S. Fukatsu, "Enhancement of Radiative Recombination in Si–based Quantum Wells with Neighboring Confinement Structure", 1995 American Institue of Physics, Appl. Phys. Lett,. 67 (4), Jul. 24, 1995, pp. 524–526.

S. Rennon, K. Avary, F. Klopf, A. Wolf, M. Emmerling, J..P. Reithmaier, A. Forchel, "Edge–emitting microlasers with a single quantam dot active layer", 17$^{th}$ Semiconductor Laser International Conference, technical digest paper THA5, pp. 139–140, no date available.

* cited by examiner

Primary Examiner—Quyen Leung
(74) Attorney, Agent, or Firm—Reed Smith LLP; Stanley P. Fisher, Esq.; Juan Carlos A. Marquez, Esq.

(57) ABSTRACT

The present invention provides a short resonator laser capable of high-speed operation with a low threshold value current and an element structure realizing a wavelength changeable laser having an excellent wavelength stability. A laser resonator waveguide is formed in such a manner that its lateral width is set to a wide value allowing lateral-multi mode at a part or the entire portion of the waveguide. This enables enhancement of a laser gain and reduction of electric resistance and thermal resistance while keeping the aforementioned characteristics of the short resonator laser. Here, by using self-focusing effect as a result of multi-mode interference effect, it is possible to reduce the mode conversion loss in the laser resonator and the light intensity distribution at the laser emitting end becomes a single-hill lowest order mode. Thus, it is possible to obtain a structure appropriate for connection with an optical fiber.

12 Claims, 9 Drawing Sheets

SEMICONDUCTOR LASER

BACKGROUND OF THE INVENTION

1. Field of the Invention

The present invention relates to a semiconductor laser and in particular, to a semiconductor laser for communication that has a short resonator and can favorably be used for high-speed modulation and wide-range wavelength change operation, and an optical module thereof.

2. Description of the Related Art

Figure 1:
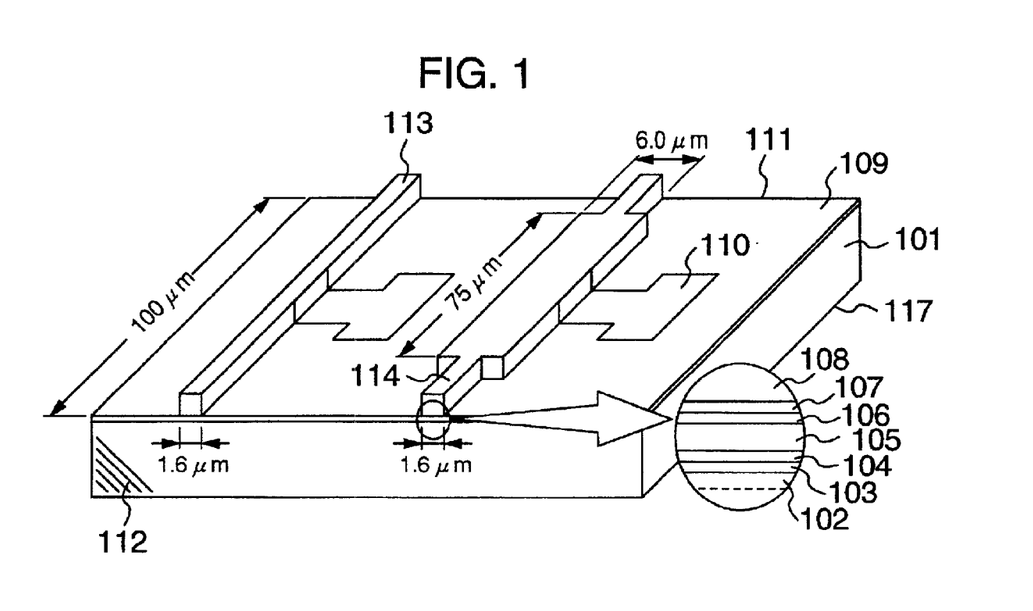
FIG. 1 is a view for explaining effects of the present invention.

It is known theoretically and experimentally that by reducing a resonator length of an end light emitting type semiconductor laser down to 200 micrometers, it is possible to lower a threshold value current flow and increase a mitigation oscillation frequency. FIG. 1 shows a calculation example of resonator-length-dependency of the laser threshold value current, mitigation oscillation frequency, and series resistance. A laser active layer is assumed to have a lattice-distortion-based InGaAsP multi-quantum well structure. From this figure, it is clear that the short resonator is advantageous for lowering a threshold value current and increase a mitigation oscillation frequency. However, when the resonator becomes shorter, the series resistance is remarkably increased and accordingly, current application to the laser is accompanied by Joule heat, thereby significantly deteriorating the optical output characteristic. For example, when the resonator has length of 100 micrometers, the series resistance reaches 20 ohms, which is four times greater than the laser resonator of 400 micrometers that is normally used. From this view point, as has been described above, the performance improvement of the semiconductor laser by reducing the resonator length can actually be realized only to 200 micrometers. On the other hand, it is known that in a distribution reflection type laser, by reducing the active area length, it is possible to obtain a stable longitudinal mode and increase the wave length changeable width. This is because a mode jump interval $\Delta\lambda$ of the distribution reflection type laser and an active area length La are in the relationship as follows: $\Delta\lambda=\lambda2/2nLa$, wherein n represents a refractive index of the laser medium and $\lambda$ represents an oscillation wavelength. In this case also, when the resonator and the active area are reduced so as to increase the $\Delta\lambda$, the laser gain is lowered, and the electric resistance and thermal resistance are increased. Accordingly, although the aforementioned effect is reported, it still cannot be used actually in practice. It should be noted that this type of semiconductor laser is described in the 17th Semiconductor Laser International Conference, technical digest paper ThA5.

SUMMARY OF THE INVENTION

It is therefore an object of the present invention to provide a short-resonator laser capable of high-speed operation with a low threshold value current and an element structure which has an excellent wavelength stability and can be changed in wavelength, and a production method thereof. Especially, the present invention has an object to realize a short-resonator laser having a resonator length not greater than 200 micrometers. Another object of the present invention is to provide an optical module using these optical elements and capable of a high-performance operation at a low cost.

In order to achieve the aforementioned objects, we have devised an element structure in which a laser short oscillator waveguide is partially or entirely increased in lateral width allowing lateral multi-mode, thereby enhancing the laser gain and reducing the electric resistance and thermal resistance. Here, by using self-focusing effect as a result of multi-mode interference effect, it is possible to reduce the mode conversion loss in the laser resonator and the light intensity distribution at the laser emitting end becomes a single-hill lowest order mode. Thus, it is possible to obtain a structure appropriate for connection with an optical fiber. Because of the laser characteristic, in this structure, it is necessary to accurately set dimension of the waveguide of the multi-mode interference waveguide portion and accordingly, the conventional cleave method having a large dimensional error cannot be used for forming the resonator. We have also devised a method for producing a laser oscillator including the multi-mode interference waveguide with a high accuracy, by using the lithography technique and the dry etching technique in combination.

Other objects, features and advantages of the invention will become apparent from the following description of the embodiments of the invention taken in conjunction with the accompanying drawings.

DETAILED DESCRIPTION OF THE EMBODIMENTS

Description will now be directed to embodiments of the present invent ion with reference to FIG. 1 to FIG. 9.

[Embodiment 1]

FIG. 1 shows an example of semiconductor laser according to the present invention having a wavelength of 1.3-micrometer band capable of high-speed modulation not smaller than 40 giga bits per second. As shown in FIG. 1, on an n-type (100)InP semiconductor substrate 101 are successively formed by the organic metal gaseous phase growth method: an n-type InP buffer layer 102 having a thickness of 1.0 micrometers; an n-type InAlAs buffer layer 103 having a thickness of 0.5 micrometers; an n-type InGaAlAs lower side light guide layer 104 having a thickness of 0.05 micrometers; a well layer of 1% compression distorted InGaAlAs (growth wavelength 1.37 micrometers) having a thickness of 6.0 nm; a 10-cycle multi-well layer 105 formed from In GaAlAs (growth speed 1.00 micrometers) isolation layer having a thickness of 10 nm; an upper side light guide layer 106 having a thickness of 0.05 micrometers; a p-type InAlAs clad layer 107 having a thickness of 0.1 micrometers; a p-type InP clad layer 108 having a thickness of 0.15 micrometers; and a high-concentration p-type InGaAs cap layer having a thickness of 0.2 micrometers. The multi-quantum well active layer 105 have light emitting wavelength of about 1.31 micrometers.

Next, by using a stripe-shaped guide mask and the known selective dry etching technique, a ridge waveguide is formed. Here, as shown in FIG. 1, in addition to a straight-line-formed mono lateral mode waveguide 113 having a width of 1.6 micrometers, a multi-mode interference waveguide 114 is formed in such a manner that the lateral width is increased at the center portion of the waveguide. By properly designing the lateral width $W_{mmi}$ and the waveguide length $L_{mmi}$, it is possible to obtain a high optical connection between the mono-mode waveguide and the multi-mode interference waveguide. Here, considering the theoretically optimal approximate value ($L_{mmi}=nW_{mmi}^2/\lambda$, wherein n is a waveguide effective refraction index and $\lambda$ is an operation wavelength), the lateral width was set to 6.0 micrometers and the length was set to 89.7 micrometers. Because of the manufacturing error, it is difficult to completely satisfy $L_{mmi}=nW_{mmi}^2/\lambda$ but an error of ±10% is normally allowed. Moreover, when considering that the lateral width $W_{mmi}$ of the multi-mode waveguide has a lower limit of about 3 micrometers and accordingly, n is assumed to be about 3.2, the $L_{mmi}$ has a lower limit of about 18 micrometers in case the wavelength is 1.55 micrometers. After this, the known ridge waveguide laser structure was subjected to wafer processing. After cutting into the element length 100 micrometers, on the front surface of the element was formed a high-reflection film 111 having a reflection factor of 80% and on the rear surface was formed a high-reflection film having a reflection factor of 97%. As shown in FIG. 1, a conventional element 113 entirely consisting of a straight waveguide is formed on the same substrate as a reference.

Figure 2:
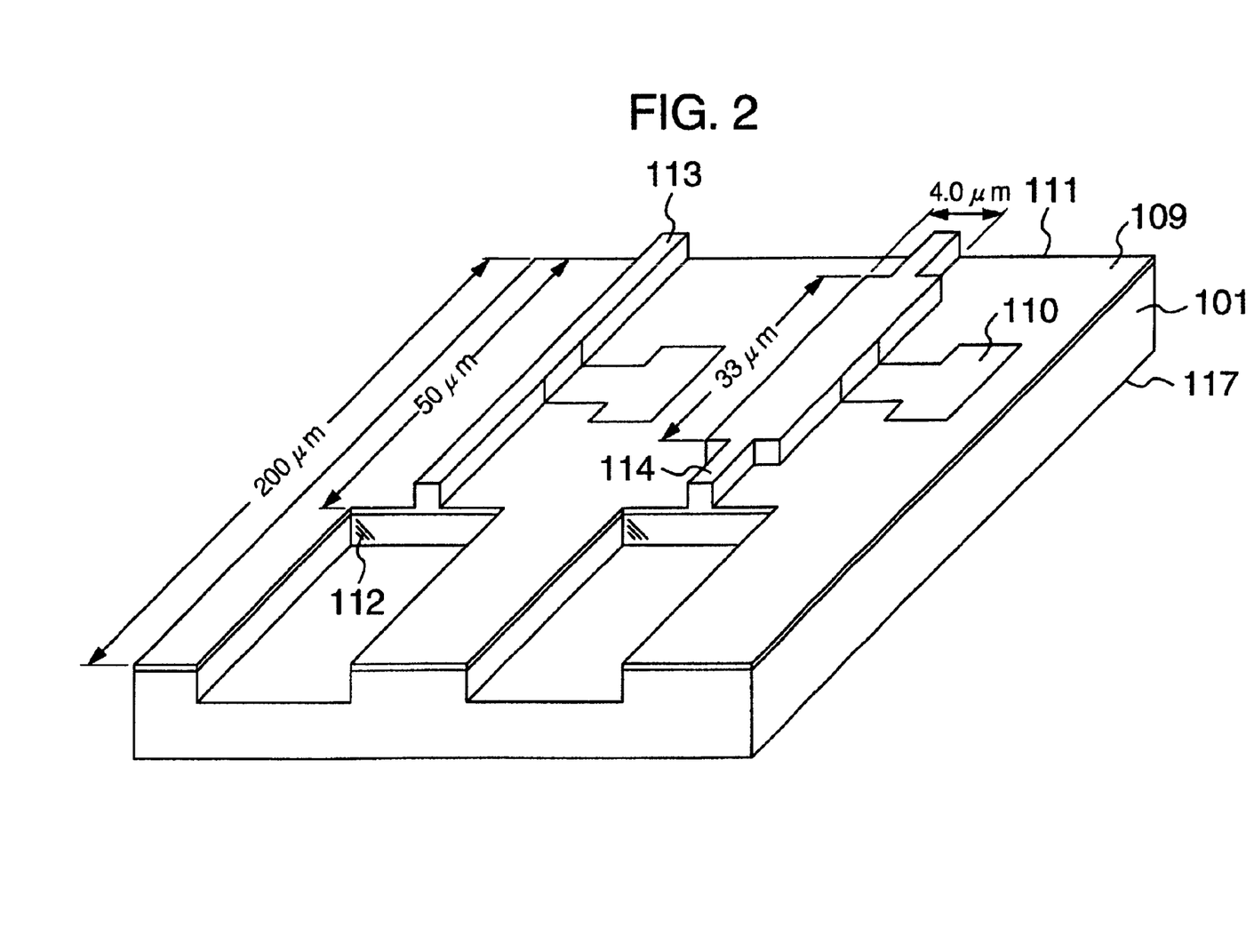
FIG. 2 is a view for explaining a first embodiment of the present invention.

FIG. 2 shows a similar embodiment. This embodiment differs from the embodiment of FIG. 1 in that the reflection surface of laser back was prepared by using the known dry etching technique. In this case, the laser resonator length can be reduced further down to 50 micrometers or less as compared to the embodiment of FIG. 1.

Figure 3:
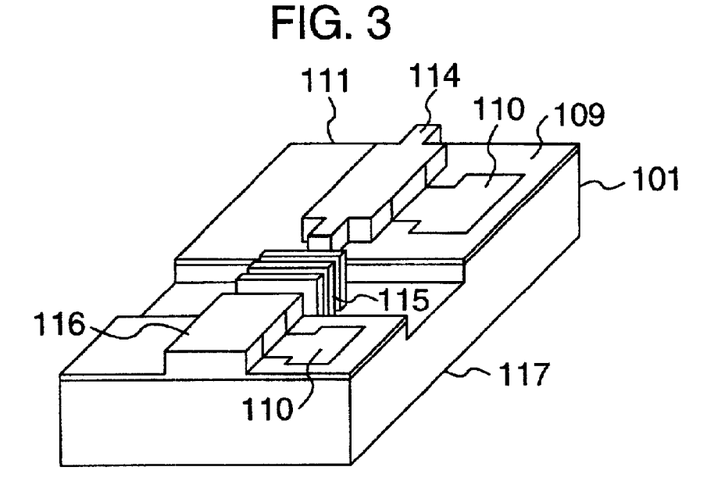
FIG. 3 is a view for explaining a modified embodiment of the present invention.

FIG. 3 shows a modification of the embodiment of FIG. 2, in which the laser back reflection mirror is replaced by the known distribution reflection mirror 115 consisting of semiconductor/air and a light output monitor 116 is monolythically integrated.

Figure 4:
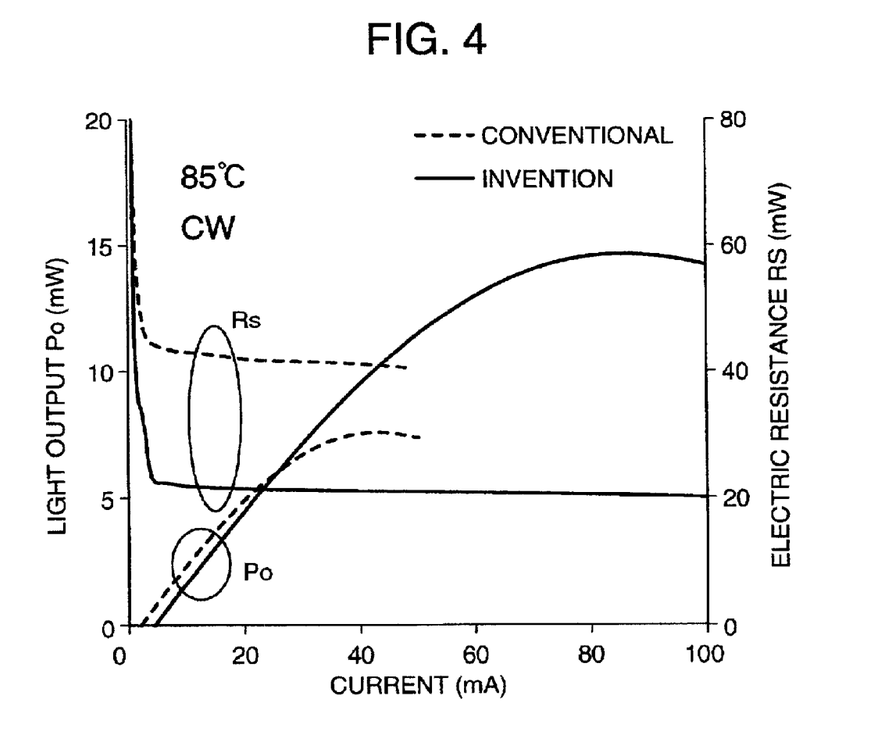
FIG. 4 is a view for explaining effects of the present invention.
Figure 5:
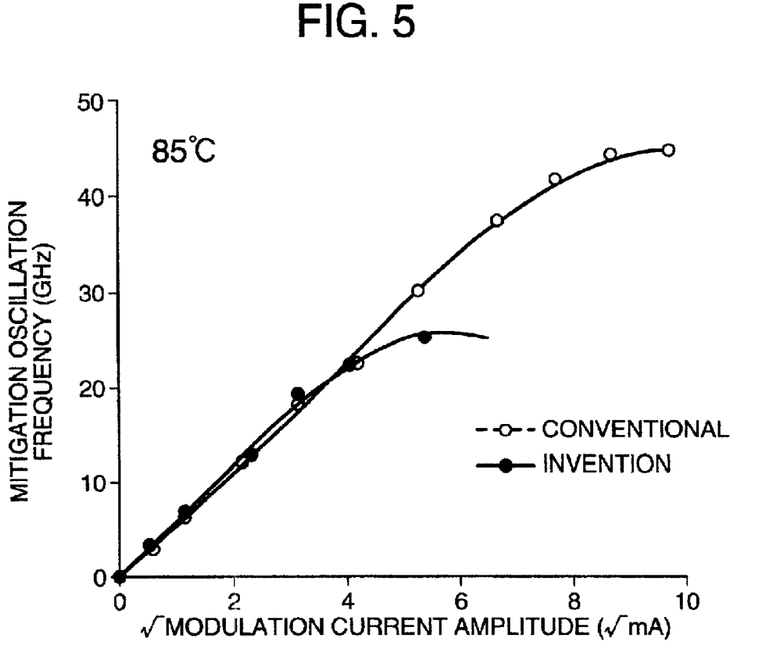
FIG. 5 is a view for explaining effects of the present invention.
Figure 6:
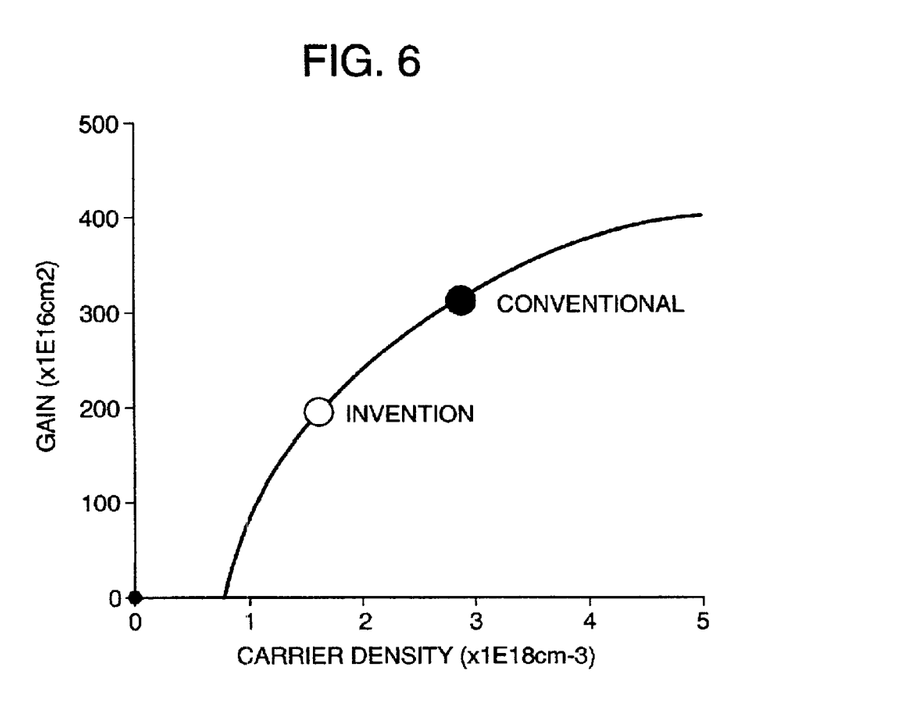
FIG. 6 is a view for explaining a principle of the present invention.

FIG. 4 shows check results of the laser element current/light output characteristics of the laser element shown in FIG. 2 under the 85° C. and CW conditions. As shown in the figure, in the conventional type straight waveguide laser, the light output was thermally saturated at a low current level of about 42 mA. The main cause of this was a high electric resistance. On FIG. 4, current dependency of electric resistance is plotted. As is clear from this plot, in the straight waveguide element, when the resonator is reduced to 50 micrometers, the resistance becomes as high as 40 ohms or above. Because of this output saturation, it becomes impossible to obtain a desired light output. Furthermore, as is clear from the current dependency of the mitigation oscillation frequency shown in FIG. 5, saturation occurs at the level of 26 GHz and it is impossible to realize a high-speed direct modulation such as 40 giga bits per second. As compared to this, in the laser using the multi-mode interference waveguide, the electric resistance is reduced to 20 ohms which is about half of the aforementioned value. This is the effect of that the current flow area is increased by introducing the multi-mode interference waveguide. This improves the saturation light output of FIG. 4 by about twice as compared to the conventional element. Moreover, the mitigation oscillation frequency can be increased to 45 GHz, thereby enabling a high-speed direct modulation of 40 giga bits per second. The present invention is further characterized in that the threshold value current density can be reduced. In the conventional element, if the resonator length is reduced to improve the high laser speed, the active volume is reduced and the threshold value carrier density is remarkably increased. For this, as shown in the gain-carrier relationship of FIG. 6, laser operates in the gain saturation region. This not only lower the differential gain but also increases non-linear type damping. As a result, both of these effects deteriorate the laser high speed. According to the present invention, the problem of increase of the threshold value current density can be solved. That is, it is possible to reduce the threshold value current density of the short resonator laser and accordingly, it is possible to simultaneously increase the mitigation oscillation frequency and suppress damping. Thus, it is possible to improve the laser high speed characteristic by a simple method.

Thus far has been explained a typical embodiment of the present invention using the ridge waveguide type laser structure formed from InGaAlAs material. The present invention can be applied to all the semiconductor materials such as InGaAsP, GaInNAs, InGaAs, InGaAlP, and the like. Moreover, the present invention can be applied not only to the ridge waveguide type laser but also to a laser having a so-called embedded hetero-structure and a embedded ridge structure.

[Embodiment 2]

Figures 7A, 7B:
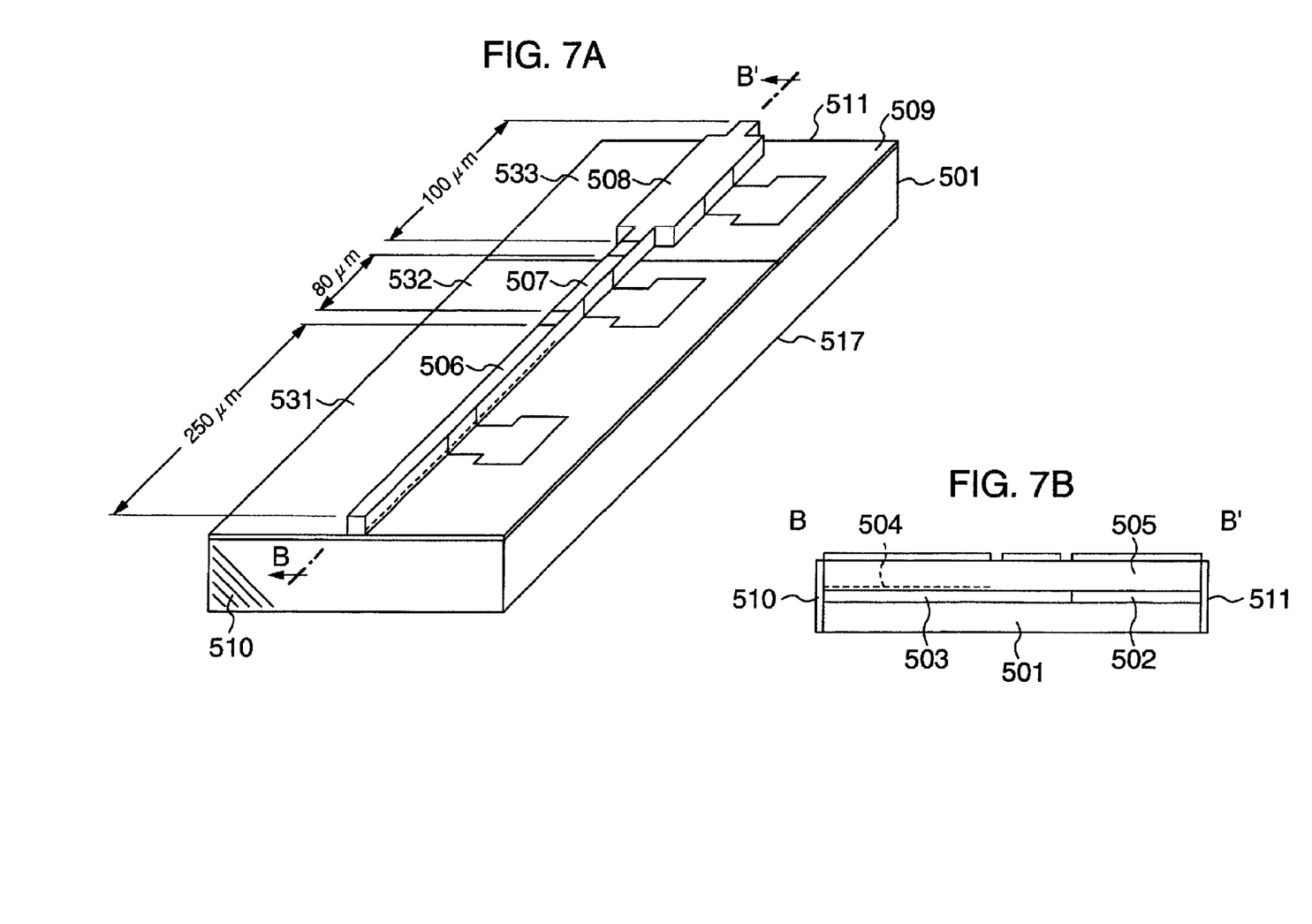
FIG. 7A is a view for explaining a second embodiment of the present invention.
FIG. 7B is a cross-sectional view of FIG. 7A at AA'.

FIG. 7 shows a 1.55-micrometer band distribution reflection type laser capable of changing an oscillation wavelength by an electric signal according to the present invention. The continuous wavelength change characteristic of the distribution reflection type laser is determined by the laser longitudinal mode jump. The laser longitudinal mode jump interval $\Delta\lambda_{DBR}$ depends on the active region length $L_a$ and is defined as follows:

$$\Delta\lambda_{DBR}=\lambda^2/2nL_a \quad (1)$$

wherein $\lambda$ is an oscillation wavelength and n is an optical refractive index of the laser medium. Accordingly, in order to enlarge the continuous wavelength change width, at least $\Delta\lambda_{DBR}$ should be increased. When the wavelength band $\lambda$ is fixed, as is clear from Equation (1), in order to increase the $\Delta\lambda_{DBR}$, the only effective means is reduction of $L_a$. In the second embodiment, like in the first embodiment, the laser characteristic deterioration such as the electric resistance increase and output lowering upon reduction of $L_a$ can be improved by introducing the multi-mode waveguide into the active region.

In FIGS. 7A and 7B, on the n-type (100) InP semiconductor substrate 501 are successively formed by the organic metal gaseous phase growth method: an n-type InGaAlAs refractive index control layer (composition wavelength 1.40 micrometers) having a thickness of 0.3 micrometers; an InAlAs etching stop layer having a thickness of 0.02 micrometers; a p-type InP spacer layer having a thickness of 0.02 micrometers; and an InGaAsP (composition wavelength 1.37 micrometers) diffraction grating supply layer 504. Next, 241-nm-cycle uniform diffraction grating is printed onto the diffraction grating supply layer 504 by the known method. Subsequently, by using the known selective etching and the known technique for directly connecting a waveguide of a different type, 5-cycle multi-quantum well layer 502 is formed from a distorted InGaAlAs material only at a portion to become an active region of the distribution reflection laser. Subsequently, a p-type InP clad layer 505 having a thickness of 1.5 micrometers and a high-concentration p-type InGaAs cap layer having a thickness of 0.2 micrometers are successively formed by the organic metal gaseous phase growth method. The multi-quantum well active layer 502 has a light emitting wavelength of about 1.56 micrometers.

Next, by using a stripe-shaped mask and the known selective dry etching technique, a ridge waveguide is formed. Here, a mono-lateral mode waveguide of strait line shape having a width of 1.6 micrometers is formed on the regions which are to become a distribution reflector and a phase adjusting area and a part of the active region. Furthermore, a multi-mode interference waveguide whose center portion has a greater width than the other portion is formed at the center portion of the active region. By designing the lateral width of this multi-mode waveguide and the length of the waveguide to be appropriate values, it is possible to realize a high optical connection between the mono-mode waveguide and the multi-mode interference waveguide. Here, the width was set to 6.0 micrometers and 74.6 micrometers. The distribution reflector, the phase adjusting region, and the active region have length of 250 micrometers, 80 micrometers, and 100 micrometers, respectively. An isolation region of 25 micrometers was provided between the respective regions. The entire element length was 480 micrometers. The wafer after the growth was subjected to wafer processing to have the known ridge waveguide laser structure and cut into the element length of 480 micrometers. After this, the element front surface was covered by a low reflection film 510 having a reflection factor of 0.1% while the element back surface was covered by a high reflection film having a reflection factor of 95%.

Figure 8A:
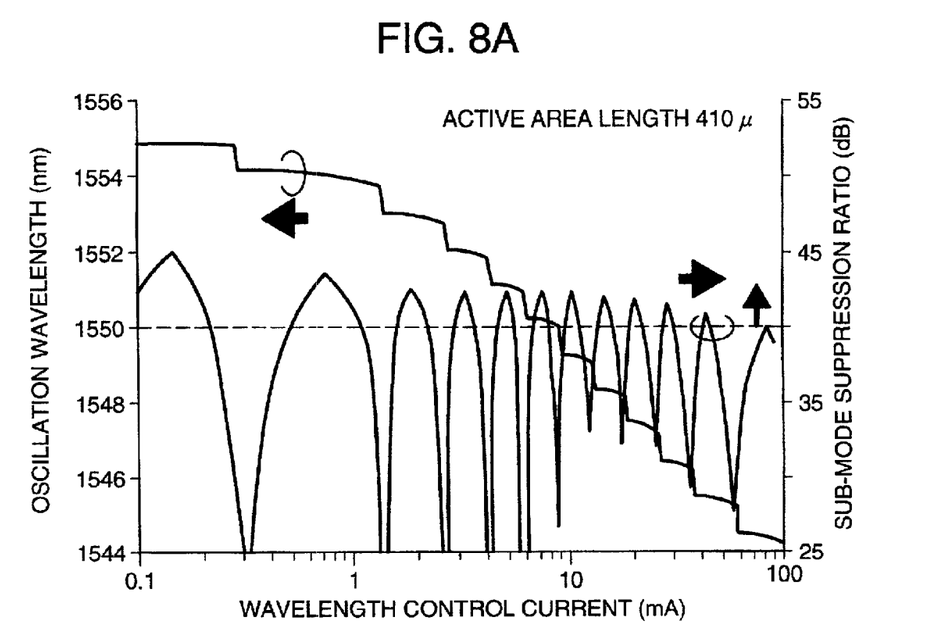
FIG. 8A is a view for explaining a wavelength tuning characteristic.
Figure 8B:
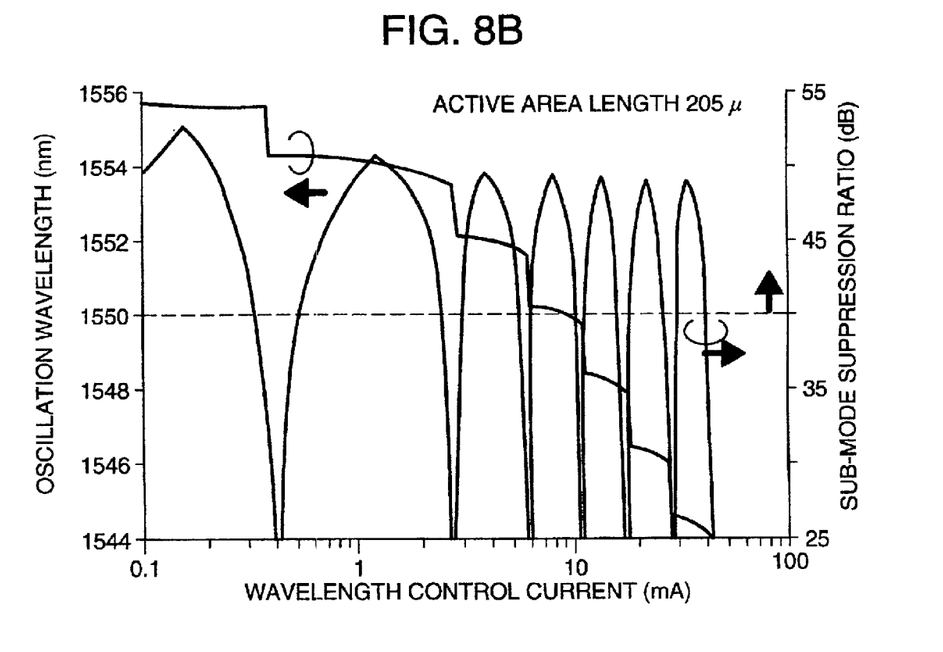
FIG. 8B is a view for explaining effects of the present invention.

The distribution reflection type laser thus prepared had mono-axis mode oscillation in the 1,550 nm band. The threshold value current was 10 mA. The chip light output at laser current of 60 mA was about 10 mW, which is sufficient for optical communication. While keeping the laser current to be 60 mA, current was applied to the distribution reflector, thereby tuning the oscillation wavelength. The wavelength change characteristic is shown in FIG. 8B. In contrast to this, FIG. 8A shows the wavelength tuning characteristic of a conventional distribution reflection type laser in which the total of the active region and the phase adjusting region is 410 micrometers. Longitudinal mode jump can be seen at wavelength interval of about 0.8 nm corresponding to 410 micrometers. This longitudinal mode jump is accompanied by a sub-mode suppression ratio greatly changing. On the other hand, in the element of the present invention, the longitudinal mode jump wavelength interval is increased to 1.6 nm and the control current interval where the longitudinal mode jump occurs is increased. This is because the total length of the active region and the phase adjusting region has been reduced to 205 micrometers, which is a significant improvement from the viewpoint of realizing the continuous wavelength tuning not causing mode jump. On the other hand, when assuming 40 dB as the mono longitudinal mode reference, in the element of the present invention, mono longitudinal mode operation of 40 dB and above is realized in a wider control current range as compared to the conventional element. It should be noted that setting of the oscillation wavelength at the wavelength between the longitudinal mode jumping is easier than adjusting the current to be applied to the phase adjusting region.

Thus, by introducing the multi-mode interference waveguide into the active region of the distribution reflection type laser, it is possible to obtain a sufficient light output while maintaining the spectrum unity upon wavelength change.

[Embodiment 3]

Figures 9A, 9B:
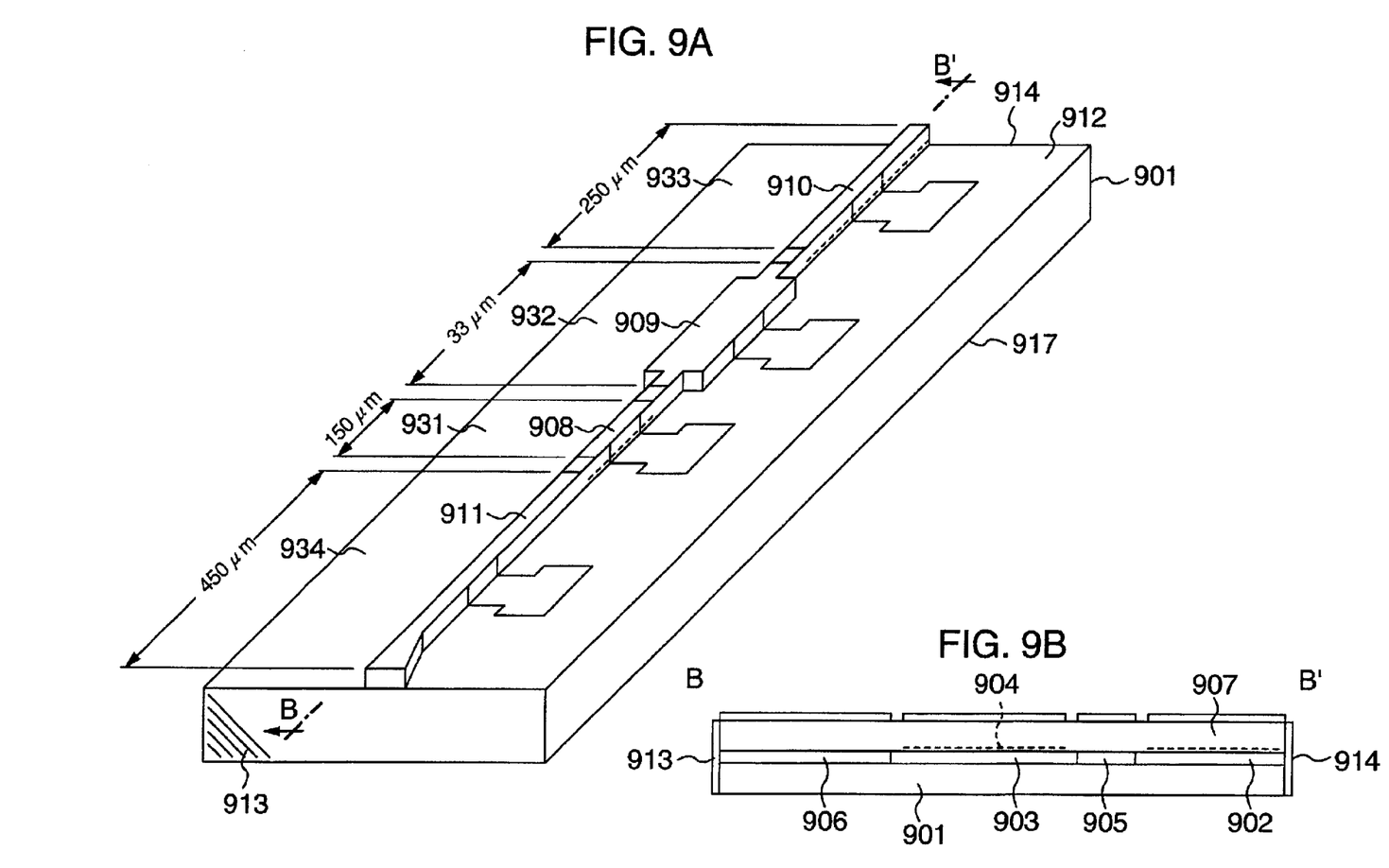
FIG. 9A is a view for explaining a third embodiment of the present invention.
FIG. 9B is a cross-sectional view of FIG. 9A at BB'.

FIGS. 9A and 9B show a third embodiment. The third embodiment is different from the second embodiment in that the active region is reduced to 33 micrometers and the continuous wavelength change region is enlarged. In this case, it is possible to continuously change wavelength by several nm without using the phase adjusting region. The basic structure and production method of the third embodiment is identical to the second embodiment except for that no phase adjusting region is provided and that the semiconductor light amplifier for increasing light output is monolythically integrated. The main difference in the laser design is that the diffraction grating has an optical coupling coefficient increased to 200 cm$^{-1}$ so as to compensate the laser gain lowering due to reduction of the active region and that the diffraction grating phase at the front and back regions of the active layer is reversed to obtain a stable mono-axis mode oscillation in the vicinity of the Bragg wavelength, thereby obtaining a so-called $\lambda/4$ shift type.

In the laser of the present invention, the continuous wavelength change width of 4 nm and the light amplifier output of 10 mV were easily obtained. In this embodiment, since the active region is short, the optical phase change in the active region due to wavelength change is very small. As a result, the longitudinal mode jump cannot be easily caused, which is the important point of the present invention. By introducing the multi-mode interference waveguide, it is possible to suppress an abrupt increase of the electric resistance, which is the essential point of the present invention.

[Embodiment 4]

Figure 10:
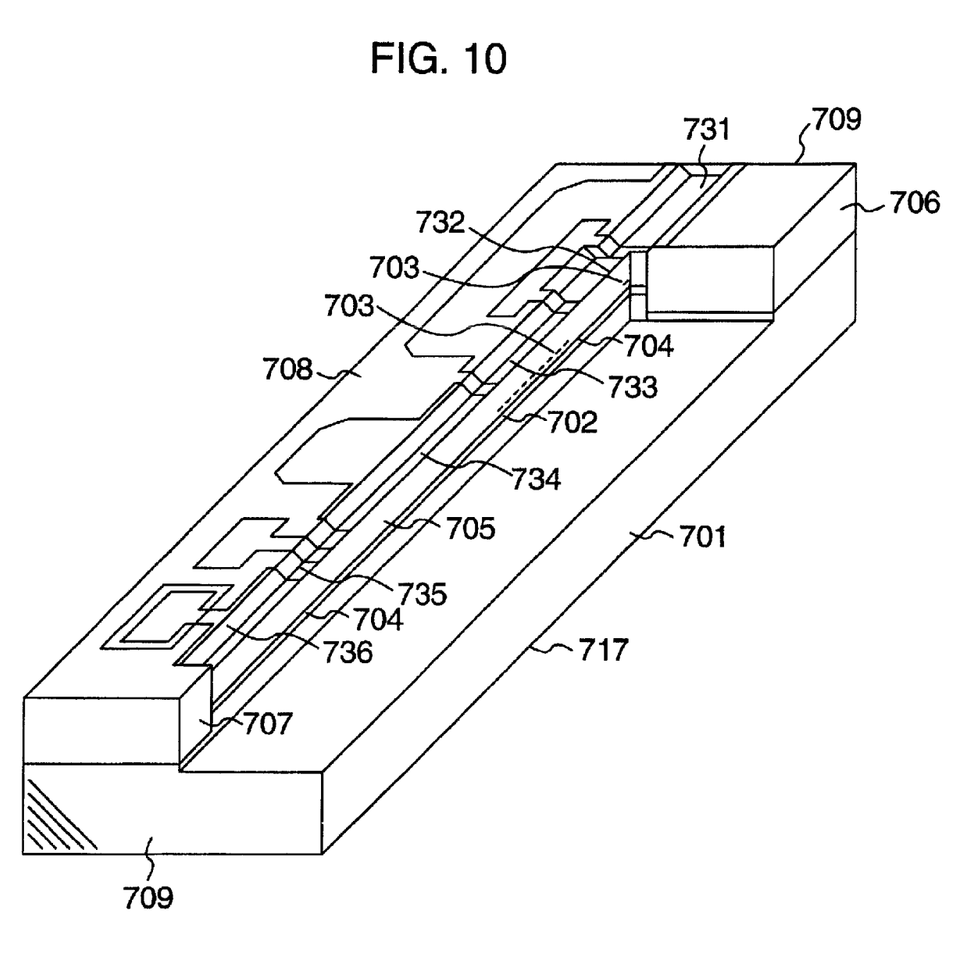
FIG. 10 is a view for explaining a fourth embodiment of the present invention.
Figure 11:
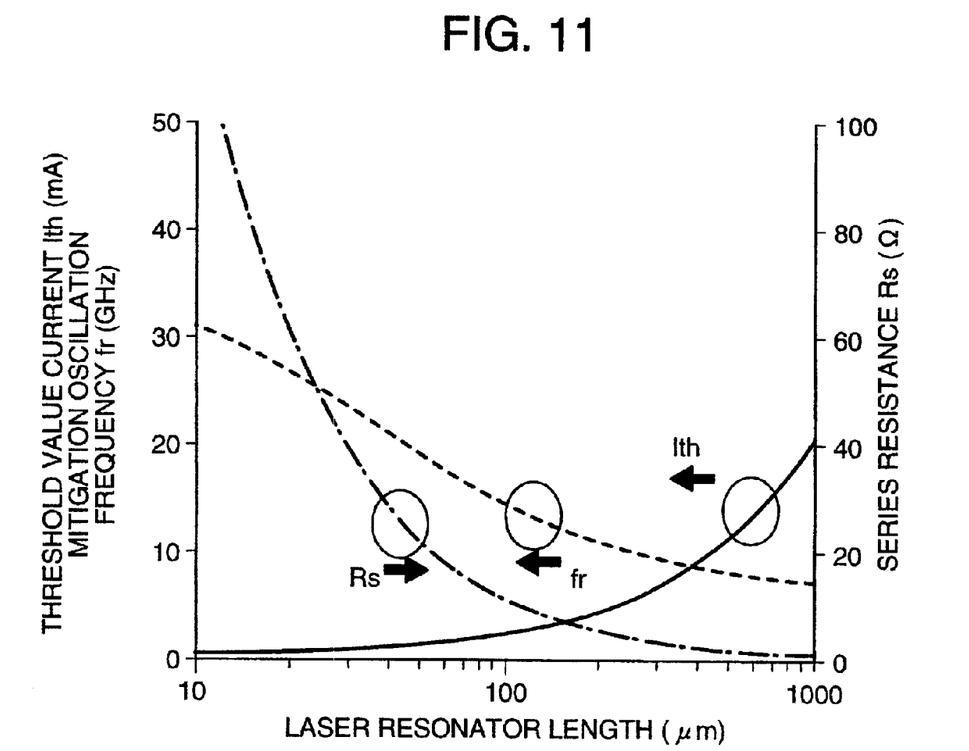
FIG. 11 is a view for explaining effects of a laser resonator length with respect to laser characteristics.

FIG. 10 shows a fourth embodiment of the present invention. The fourth embodiment is different from the third embodiment in that a field absorption type optical modulator 736 and a power monitor 735 are monolythically integrated. In this case, in addition to the wide range continuous wavelength change characteristic, it is possible to realize a low-chirp high-speed modulation and to provide a light source especially preferable for a high-density wavelength multi-optical transmission.

The advantage obtained by introducing the multi-mode interference waveguide has been thus far explained by using the Embodiments 2 to 4. This effect can also be applied to a similar improved distribution reflection type laser using a sample diffraction grating structure, a super structure diffraction grating structure, and the like.

By using the semiconductor light emitting element according to the embodiments of the present invention, it is possible to realize direct modulation of 40 giga or above per second. It is also possible to reduce the cost of the optical components, to reduce the cost of the optical communication system using this element, and to realize a large capacity. Moreover, the present invention provides quite a simple method for producing a wavelength change distribution reflection type semiconductor laser operating with a stable mono-mode and high output as well as an optical module using the same. By using the embodiments of the present invention, it is possible not only to significantly enhance the element performance and production yield but also to improve the optical communication system using the element in cost, capacity, and distance.

It should be further understood by those skilled in the art that the foregoing description has been made on embodiments of the invention and that various changes and modifications may be made in the invention without departing from the spirit of the invention and the scope of the appended claims.

What is claimed is:

1. A semiconductor laser comprising: a semiconductor substrate; a core region defined by an active layer formed on one side of the semiconductor substrate; and a clad region defined by at least one clad layer overlaying the active layer,
wherein the core region has a gain region with a length not smaller than 18 micrometers and not greater than 200 micrometers along an optical axis or at least the core region or the clad region; at least one of the core region and the clad region has a stripe shape and a stripe width modulated in a direction parallel with a surface of the substrate and perpendicular to the optical axis such that the center portion of the stripe, which works as a multi-mode interference waveguide enabling a lateral multi-mode, has a wider width than vicinity portions of the stripe, each of which works as a mono-mode waveguide,
said multi-mode interference waveguide has a rectangular plane shape with a lateral width W and a waveguide length L which are decided so that a light intensity distribution at an output terminal of said multi-mode interference waveguide becomes a single-hill lowest order mode, and
W, L, an effective refractive index n of a laser waveguide, and an operation wavelength λ are decided so as to satisfy a formula as follows:

$$0.9nW^2/\lambda \leq L \leq 1.1nW^2/\lambda.$$

2. The semiconductor laser as claimed in claim 1, wherein the multi-lateral mode interference waveguide has a width W in a range from 3 to 10 micrometers.

3. The semiconductor laser as claimed in claim 1, further comprising a reflection mirror formed by etching the clad region and the core region.

4. The semiconductor laser as claimed in claim 1, wherein a diffraction grating is formed in the portion mono mode waveguide portion to provide a Bragg reflector therein.

5. The semiconductor laser as claimed in claim 4, wherein the Bragg reflector has a reflection wavelength changed by an external signal so as to artificially change the operation wavelength.

6. An optical module comprising at least an optical fiber for introducing light outside and a semiconductor laser that includes a semiconductor substrate; a core region defined by an active layer formed on one side of the semiconductor substrate; and a clad region defined by at least one clad layer overlaying the active layer,
wherein the core region has a gain region with a length not smaller than 18 micrometers and not greater than 200 micrometers along an optical axis of at least the core region or the clad region; at least one of the core region and the clad region has a stripe shape and a stripe width modulated in a direction parallel with a surface of the substrate and perpendicular to the optical axis such that the center portion of the stripe, which works as a multi-mode interference waveguide enabling a lateral multi-mode, has a wider width than vicinity portions of the stripe, each of which works as a mono-mode waveguide,
said multi-mode interference waveguide has a rectangular plane shape with a lateral width W and a waveguide length L which are decided so that a light intensity distribution at an output terminal of said multi-mode interference waveguide becomes a single-hill lowest order mode, and
W, L, an effective refractive index n of a laser waveguide, and an operation wavelength λ are decided so as to satisfy a formula as follows:

$$0.9nW^2/\lambda \leq L \leq 1.1nW^2/\lambda.$$

7. A semiconductor laser comprising: a semiconductor substrate; a core region defined by an active layer formed on one side of the semiconductor substrate; and a clad region defined by at least one clad layer at least overlaying the active layer,
wherein the core region has a gain region with a length not smaller than 5 micrometers and not greater than 200 micrometers along an optical axis of at least the core region or the clad region; at least one of the core region and the clad region has a stripe shape and a strive width modulated in a direction parallel with a surface of the substrate and perpendicular to the optical axis such that the center portion of the stripe, which works as a multi-mode interference waveguide enabling a lateral multi-mode, has a wider width than vicinity portions of the stripe, each of which works as a mono-mode waveguide,
said multi-mode interference waveguide has a rectangular plane shape with a lateral width W and a waveguide length L which are decided so that a light intensity distribution at an output terminal of said multi-mode interference waveguide becomes a single-hill lowest order mode, and
W, L, an effective refractive index n of a laser waveguide, and an operation wavelength λ are decided so as to satisfy a formula as follows:

$$0.9nW^2/\lambda \leq L \leq 1.1nW^2/\lambda.$$

8. The semiconductor laser as claimed in claim 1, wherein the multi-lateral mode interference waveguide has a width W in a range from 3 to 10 micrometers.

9. The semiconductor laser as claimed in claim 7, further comprising a reflection mirror formed by etching the clad region and the core region.

10. The semiconductor laser as claimed in claim 7, wherein a diffraction grating is formed in the portion-mono mode waveguide portion to provide a Bragg reflector therein.

11. The semiconductor laser as claimed in claim 10, wherein the Bragg reflector has a reflection wavelength changed by an external signal so as to artificially change the operation wavelength.

12. An optical module comprising at least an optical fiber for introducing light outside and a semiconductor laser that includes a semiconductor substrate; a core region defined by an active layer formed on one side of the semiconductor substrate; and a clad region defined by at least one clad layer overlaying the active layer,
wherein the core region has a gain region with a length not smaller than 5 micrometers and not greater than 200 micrometers along an optical axis of at least the core region or the clad region; at least one of the core region and the clad region has a stripe shape and a stripe width modulated in a direction parallel with a surface of the substrate and perpendicular to the optical axis such that the center portion of the stripe, which works as a multi-mode interference waveguide enabling a lateral multi-mode, has a wider width than vicinity portions of the stripe, each of which works as a mono-mode waveguide, said multi-mode interference waveguide has a rectangular plane shape with a lateral width W and a waveguide length L which are decided so that a light intensity distribution at an output terminal of said multi-mode interference waveguide becomes a single-hill lowest order mode, and W, L, an effective refractive index n of a laser waveguide, and an operation wavelength $\lambda$ are decided so as to satisfy a formula as follows:

$$0.9nW^2/\lambda \leq L \leq 1.1nW^2/\lambda.$$

* * * * *